(12) United States Patent  
Mason et al.

(10) Patent No.: US 9,037,894 B1
(45) Date of Patent: May 19, 2015

(54) DEVICES AND METHODS USING SUPERVISOR CHIPS (INTEGRATED CIRCUITS) TO GENERATE TIME ACCEPTANCE WINDOWS

(71) Applicant: The United States of America as Represented by the Secretary of the Navy, Washington, DC (US)

(72) Inventors: Deric Keith Mason, Ridgecrest, CA (US); Michael David Haddon, Ridgecrest, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 363 days.

(21) Appl. No.: 13/753,276

(22) Filed: Jan. 29, 2013

Related U.S. Application Data

(60) Provisional application No. 61/594,272, filed on Feb. 2, 2012.

(51) Int. Cl.
*G06F 1/00* (2006.01)
*F23Q 7/02* (2006.01)
*H03K 3/01* (2006.01)
*F42C 15/00* (2006.01)

(52) U.S. Cl.
CPC ........ *H03K 3/01* (2013.01); *F42C 15/00* (2013.01); *G06F 1/00* (2013.01)

(58) Field of Classification Search
USPC .......................... 713/500, 501; 102/206, 276
See application file for complete search history.

(56) References Cited

U.S. PATENT DOCUMENTS

| | | | | |
|---|---|---|---|---|
| 3,967,557 A | * | 7/1976 | Irish, Jr. ................ | 102/216 |
| 5,415,100 A | * | 5/1995 | Tolley ..................... | 102/276 |
| 7,342,328 B1 | * | 3/2008 | Eddleman ............... | 307/80 |
| 7,748,324 B2 | * | 7/2010 | Sutcliffe ................. | 102/265 |
| 2011/0277620 A1 | * | 11/2011 | Havran et al. .......... | 89/1.14 |

OTHER PUBLICATIONS

Dual-/Triple-/Quad-Voltage, Capacitor-Adjustable, Sequencing/Supervisory Circuits, Maxim Integrated Products, Jan. 2007.*

* cited by examiner

*Primary Examiner* — Khanh Dang
(74) *Attorney, Agent, or Firm* — Christopher L. Blackburn

(57) ABSTRACT

Timing circuits including supervisor chip(s), capacitors, and latches. The supervisor chip(s) and capacitors cooperate to generate an electrical signal (window signal) having a high logic state when the window is open. The latches are used to determine whether an event of interest occurred while the window was open using the generated window signal and an electrical signal asserted upon occurrence of the event of interest.

9 Claims, 7 Drawing Sheets

US 9,037,894 B1

DEVICES AND METHODS USING SUPERVISOR CHIPS (INTEGRATED CIRCUITS) TO GENERATE TIME ACCEPTANCE WINDOWS

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The field of the invention is timing circuits.

Figure 1A:
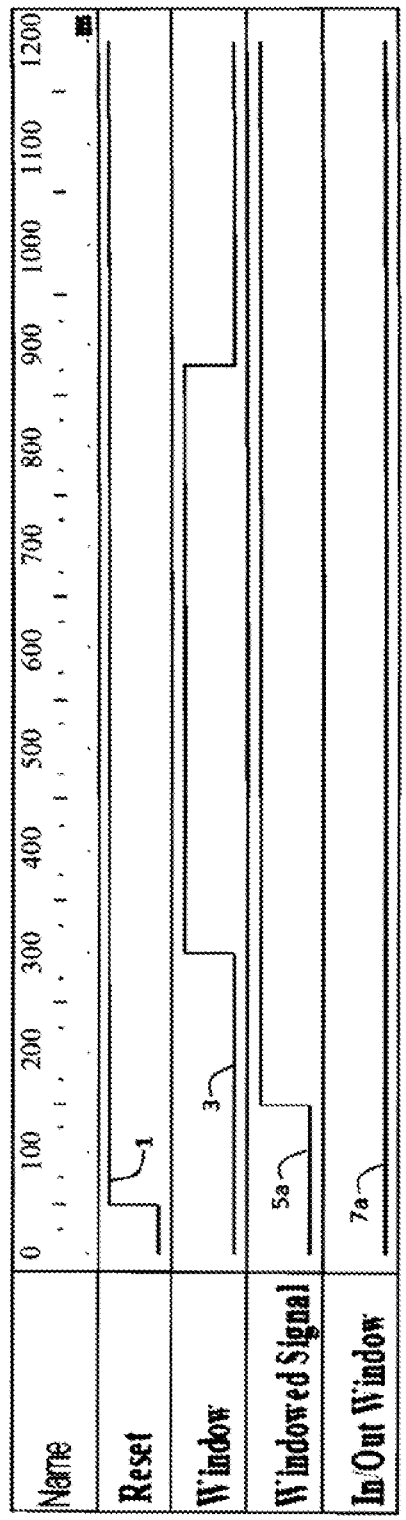
FIG. 1A is a timing diagram of circuit signals generated and/or used in an embodiment of the invention operating in an exemplary scenario.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

Embodiments of the invention are timing circuits that employ supervisor chips, capacitors, and latches. Like reference numbers indicate like elements.

The term "Start Signal", as used herein, is an electrical signal that is asserted by a Start Signal source upon occurrence of a first event. Start Signal source is any electronic component, such as a voltage detector, adapted to assert a logic high signal upon command. Start Signal is applied high to a supervisor chip's input upon occurrence of the first event (or some known time thereafter as controlled by preliminary circuitry). The time at which Start Signal is applied to the supervisor chip's voltage monitor input at a voltage above the chip's input voltage threshold (logic high) constitutes the timing window's time zero, where the window is opened some time after time zero. The amount of time between occurrence of first event, i.e., time after assertion of Start Signal by Start Signal source, and the moment Start Signal is applied high at supervisor chip's input can be controlled by preliminary circuitry using any known arrangement of circuitry.

The term "Windowed Signal" as used herein is an electrical signal that is asserted by a Windowed Signal source upon occurrence of a second event. Windowed Signal source is any electronic component, such as a pull-up resistor, adapted to assert a logic high signal upon command. Windowed Signal is applied high to a latch's input upon occurrence of second event (or some known time thereafter). The invention monitors Windowed Signal to determine whether second event occurred within a pre-determined time after occurrence of first event. The state of the timing window at the time when the Windowed Signal is asserted high (or some known time thereafter as defined by preliminary circuitry) is saved and is used as the output state for the timing circuit. The amount of time between occurrence of second event, i.e., time after assertion of Windowed Signal by Windowed Signal source, and the moment Windowed Signal is applied high at first latch's input can be controlled by preliminary circuitry using any known arrangement of circuitry.

Some embodiments of this invention can serve as timing mechanisms in safe/arm fuze modules of weapons (such as bombs and missiles). It is the fuze's job to verify the proper environments and arm the weapon, or to reject an improper environment and safe the weapon. Embodiments of the invention allow for very accurate, and very small timing circuits for use in a fuzing system. As an example of how embodiments of the invention would be employed in a weapon's fuze module, in some embodiments, where it is desired to verify that a first event necessary for arming a fuze (first arming event) occurred before a second event necessary for arming the fuze (second arming event), and that the second arming event occurred within a pre-determined window after the first arming event, Start Signal would be asserted upon occurrence of the first arming event and Windowed Signal would be asserted upon verification of the second arming event and monitored by the timing circuit to determine whether the second arming event occurred within a predetermined window after the first arming event. Arming events can be any events that indicate a safe separation of a weapon from its launch vehicle, such as, for example: 1) a first arming event could be that a weapon's thermal battery is activated (in response to a fire command) and is supplying the fuze power reaching a minimum amplitude; and 2) a second arming event can be that the weapon's umbilical has been severed (by launch). In this example, the timing circuit would require that the weapon's umbilical was severed for the first time within a pre-determined window after the thermal battery was activated. These examples of arming events are provided for illustrative purposes only; other events can be used to trigger Start Signal and/or monitored (Windowed Signal) without departing from the principles of the invention.

Embodiments employ commercial-off-the-shelf supervisor chip(s) to handle timing of the window. The term "supervisor chip" as used herein, is an integrated circuit adapted to operate state wise as described in Tables 1, 2, and/or 3. In some embodiments, the commercial-off-the-shelf supervisor chip(s) are selected from the following set of supervisor chips (described infra): 1) Maxim's MAX6898AALT; 2) Maxim's MAX6897AALT; and 3) Maxim's MAX 16026 chip. These supervisor chips contain at least one temperature compensated constant current supply, which is/are used to charge external capacitors. The temperature compensated constant current supply creates a very stable window over temperature.

General Embodiments

Embodiments of the invention include a logic supply voltage source supplying a Vcc voltage. This can be any DC voltage source sufficient to power the circuit components. In some embodiments, Vcc is 5, 3.3, 2.5, or 1.8 Volts.

Figure 3:
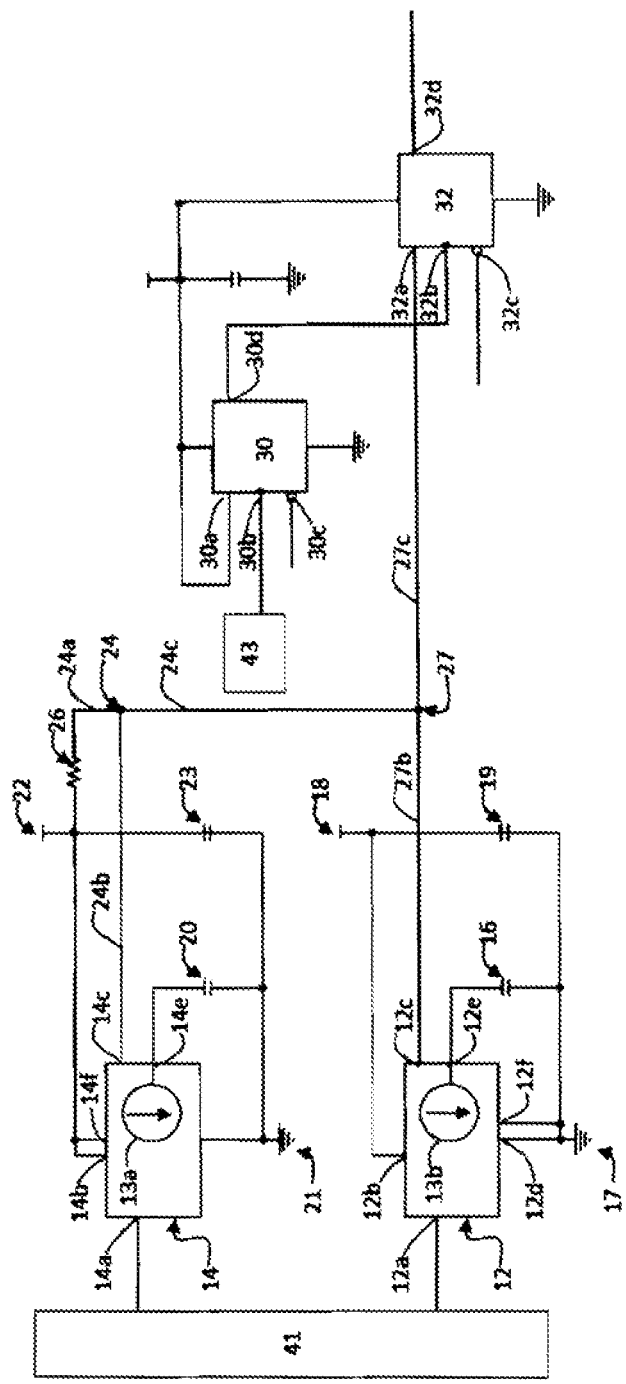
FIG. 3 is an embodiment of a timing circuit employing multiple supervisor chips to create a timing window.
Figure 5:
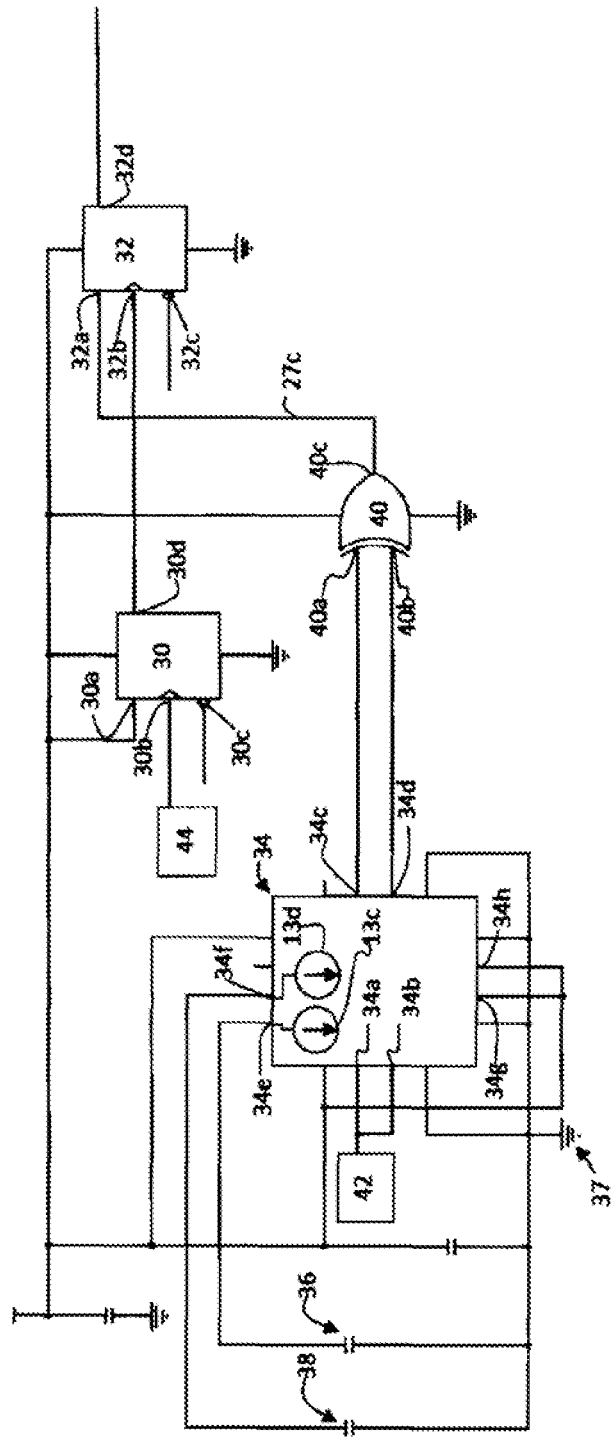
FIG. 5 is an embodiment of a timing circuit employing a single supervisor chip to create a timing window.

With reference to FIGS. 3 and 5, embodiments include at least one sequencer chip adapted to cooperate with additional circuitry to create the timing window. The timing window opens a first pre-determined amount of time after zero (time zero being when Start Signal is applied high to the supervisor chip's input) and remains open a second pre-determined amount of time. The timing window is electronically represented as Window Signal (an electronic signal being at either a high or low logic state); the timing window is open when Window Signal is in a logic high state and closed when Window Signal is in a logic low state.

Embodiments include a first latch 30 having a first latch d input 30a, a first latch clock input 30b, a first latch clear input 30c, and a first latch q output 30d. Windowed Signal is applied high to the first latch clock input 30b upon occurrence (or some known time after occurrence) of the second event. First latch 30 asserts a logic level high signal at first latch q output 30d when Windowed Signal is applied high to first latch 30, so long as first latch clear input 30c is logic high at the time Windowed Signal is applied high to first latch 30. Upon power up, first latch clear input 30c is logic low. This ensures the first latch q output 30d is also low upon power up because any time first latch clear input 30c is logic low, it forces the first latch q output 30d to also be logic low. First latch q output 30d can only transition to logic high if Windowed Signal is asserted during a time when first latch clear input 30c is at a logic high level.

Embodiments of the invention include a second latch 32 having a second latch d input 32a, a second latch clock input 32b, a second latch clear input 32c, and a second latch q output 32d. First latch q output 30d is electrically connected to second latch clock input 32b. Window Signal is applied to second latch d input 32a via window signal electrical line 27c. Second latch 32 is adapted to latch in a logic state of the Window Signal at a time of a first low-to-high transition of Windowed Signal. Therefore, in embodiments in which Windowed Signal gets applied high to first latch upon occurrence of the second event, second latch 32 will latch in logic state of Window Signal applied to second latch upon occurrence of the second event.

Figure 1B:
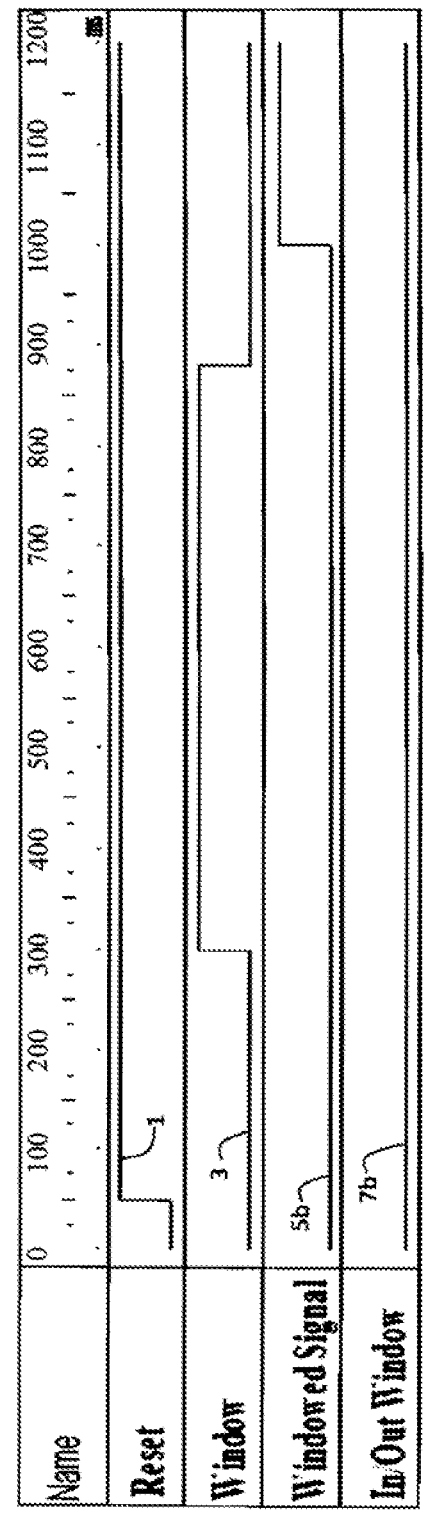
FIG. 1B is a timing diagram of circuit signals generated and/or used in an embodiment of the invention operating in a scenario different than the scenarios of FIGS. 1A and 1C.
Figure 1C:
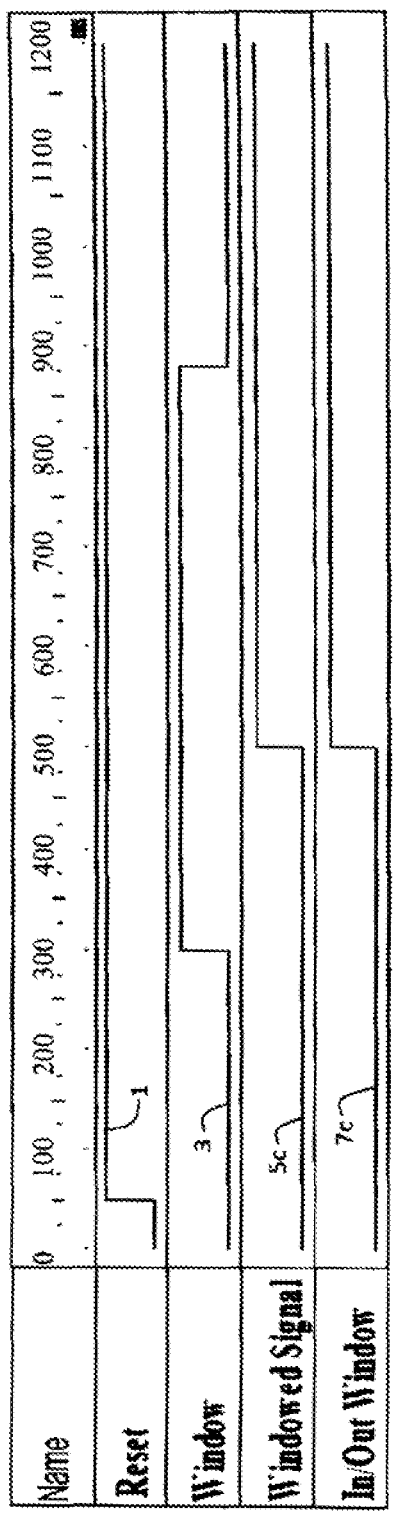
FIG. 1C is a timing diagram of circuit signals generated and/or used in an embodiment of the invention operating in a scenario different than the scenario of FIGS. 1A and 1B.

Operation of embodiments of the circuit during three different scenarios is described with reference to timing diagrams in FIGS. 1A-C. 1 represents the Reset signal and does not vary throughout the scenarios. 3 represents Window Signal and also does not vary throughout the scenarios. 5a, 5b, and 5c represent the scenario's Windowed Signal. 7a, 7b, and 7c represent the scenarios' In/Out Window signal; this signal is the state at which the circuit is saved/locked and indicates whether the first transition of Windowed Signal (at first latch input) to logic high occurred while Window Signal was logic high. In FIG. 1a, Windowed Signal 5a transitions from logic low to logic high at about 150 milliseconds, which is before Window Signal 3 becomes high at 300 milliseconds; therefore, as Windowed Signal 5a did not first transition to logic high while Window Signal 3 was logic high, In/Out Window signal 7a is logic low. In FIG. 1b, Windowed Signal 5b transitions from logic low to logic high at about 1 second, which is after Window Signal 3 drops from logic high to logic low at about 880 milliseconds; therefore, as Windowed Signal 5b did not first transition to logic high while Window Signal 3 was logic high, In/Out Window signal 7b is logic low. In FIG. 1c, Windowed Signal 5c transitions from logic low to logic high at about 500 milliseconds, which is while Window Signal 3 is logic high; therefore, as Windowed Signal 5c first transitioned to logic high while Window Signal 3 was logic high, In/Out Window signal 7c is logic high when Windowed Signal 5c is asserted high (this is the positive assertion that the Windowed Signal first transitioned from low to high while Window Signal 3 was open).

Multi-Supervisor Chip Embodiments

Embodiments using two supervisor chips to create the timing window (and assert a logic high state for the Window Signal) are described with reference to FIG. 3 and Tables 1 and 2. In some embodiments, Maxim's MAX6898AALT serves as a first supervisor chip 12 and Maxim's MAX 6897AALT serves as a second supervisor chip 14; however, any supervisor chips that perform state wise as in Tables 1 and/or 2 (as applicable) can be used.

TABLE 1

| MAXIM MAX6897AALT Chip | | |
|---|---|---|
| IN | ENABLE | OUT |
| Vin < Vthreshold | Low | Low |
| Vin < Vthreshold | High | Low |
| Vin > Vthreshold | Low | Low |
| Vin > Vthreshold | High | High impedance after capacitor determined time delay; Logic low before capacitor determined time delay |

As Table 1 indicates, when the voltage at 14a is greater than a pre-determined input voltage threshold, and the signal at enable pin 14f is high, the output pin 14c is high impedance after a capacitor determined time delay; the remainder of the time, 14c asserts a logic low signal.

TABLE 2

| MAXIM MAX6897AALT Chip | | |
|---|---|---|
| IN | ENABLE | OUT |
| Vin < Vthreshold | Low | High impedance |
| Vin < Vthreshold | High | High impedance |
| Vin > Vthreshold | Low | Logic low after capacitor determined time delay; high impedance before capacitor determined time delay |
| Vin > Vthreshold | High | High impedance |

As Table 2 indicates, when the voltage at 12a is greater than the chip's pre-determined input voltage threshold, and the signal at enable pin 12f is low (in this case the ENABLE pin is an active low input) the output pin 12c is low after a capacitor determined time delay; the remainder of the time 12c is of high impedance.

First supervisor chip 12 and second supervisor chip 14 each have an internal current source 13b, 13a respectively that delivers a constant current to its delay pin in response to Start Signal being applied high (above pre-determined voltage input threshold) to the supervisor chip's input.

With reference to FIG. 3, these embodiments include a first timing capacitor 16. First timing capacitor 16 is electrically connected between first supervisor chip delay pin 12e and ground 17. Logic supply voltage source 18 is electrically connected to first supervisor chip Vcc input 12b. Capacitor 19 is electrically connected between logic supply voltage source 18 and ground 17. First supervisor chip enable pin 12f is also connected to ground 17. Capacitor 19 serves as a noise decoupling capacitor to ensure power supply to logic in the supervisor chip is clean. Any capacitor suitable to clean the power supply to logic can be used for capacitor 19; in the illustrated embodiment, capacitor 19 is a 1 microfarad capacitor.

First supervisor chip output 12c is low when: 1) ground is applied to first supervisor chip enable pin 12f; 2) Start Signal is applied high (above pre-determined voltage input threshold) to first supervisor chip input 12a; and 3) voltage at first supervisor chip delay pin 12e is greater than a first pre-determined voltage. In operation, when the Start signal is applied high to first supervisor chip input 12a, current from internal current source 13b is delivered to first supervisor chip delay pin 12e, where it flows to and charges first timing capacitor 16. Timing capacitor's 16 voltage increases linearly in response to the constant current from current source 13b. After Start Signal is applied high to first supervisor chip's input 12a, but before timing capacitor 16 reaches the voltage necessary to make the voltage at first supervisor chip delay pin 12e greater than the first pre-determined delay voltage threshold, first supervisor chip output 12c is high impedance. A pre-determined amount of time after Start Signal is applied high to first supervisor chip input 12a, voltage at first supervisor chip delay pin 12e becomes greater than the pre-determined delay voltage threshold because timing capacitor has been charged, at which point first supervisor chip output 12c asserts a logic low signal. The first pre-determined amount of time after Start Signal is applied high at first supervisor chip input 12a before output 12c asserts logic low is an amount of time it takes voltage at first supervisor chip delay pin 12e to reach first pre-determined delay voltage threshold after first supervisor chip internal current source 13b begins to charge first timing capacitor 16. The capacitance of first timing capacitor 16 is selected such that the amount of time it takes first supervisor chip delay pin 12e to reach the first supervisor chip's delay voltage threshold in response to supplying first timing capacitor 16 current from internal current source 13b is equal to the time after applying Start Signal high to first supervisor chip input 12a at which user desires the closing edge of the window to occur. In the illustrated embodiment, first timing capacitor 16 is 0.22 microfarads and the pre-determined amount of time after applying Start Signal high to first supervisor chip input 12a at which the closing edge of the window will occur is 880 milliseconds.

These embodiments further include a second timing capacitor 20. Second timing capacitor 20 is electrically connected between second supervisor chip delay pin 14e and ground 21. Logic supply voltage source 22 is electrically connected to second supervisor chip enable pin 14f and second supervisor chip Vcc input 14b. Capacitor 23 is electrically connected between logic supply voltage source 22 and ground 21. Capacitor 23 serves as a noise decoupling capacitor to ensure power supply to logic in the supervisor chip is clean. Any capacitor suitable to clean the power supply to logic can be used for capacitor 23; in the illustrated embodiment, capacitor 23 is a 1 microfarad capacitor.

In operation, second supervisor chip's internal current source 13a begins delivering its current to second supervisor chip delay pin 14e upon applying Start Signal high to second supervisor chip input 14a and applying Vcc to second supervisor chip enable pin 14f; the current delivered to second supervisor chip delay pin 14e charges second timing capacitor 20. Timing capacitor's 20 voltage increases linearly in response to the constant current from current source 13a. After Start Signal is applied high to second supervisor chip input 14a, but before timing capacitor 20 reaches the voltage necessary to make the voltage at first supervisor chip delay pin 14e greater than the second supervisor chip's pre-determined delay voltage threshold, second supervisor chip output 14c asserts a logic low signal. A pre-determined amount of time after Start Signal is applied to second supervisor chip input 14a, voltage at second supervisor chip delay pin 14e becomes greater than the second supervisor chip's pre-determined delay voltage threshold amount because timing capacitor 20 has been charged, at which point second supervisor chip output 14c becomes high impedance. The second pre-determined amount of time after Start Signal is asserted high before output 14c becomes high impedance is the amount of time it takes voltage at second supervisor chip delay pin 14e to reach second supervisor chip's pre-determined delay voltage threshold after second supervisor chip internal current source 13a begins to charge second timing capacitor 20. The capacitance of second timing capacitor 20 is selected such that the amount of time it takes second supervisor chip delay pin 14e to reach the second supervisor chip's pre-determined delay voltage threshold in response to supplying second timing capacitor 20 current from internal current source 13a is equal to the time after applying Start Signal high to second supervisor chip input 14a at which user desires the opening edge of the window to occur. In the illustrated embodiment, second timing capacitor 20 is 0.075 microfarads and the pre-determined amount of time after applying Start Signal high to first supervisor chip input 14a at which the opening edge of the window will occur is 300 milliseconds.

These embodiments include a window signal electrical line 27c to carry Window Signal (electrical signal that is logic high when window is open and logic low when window is closed). These embodiments include a first electrical T junction 24, wherein a first arm 24a of first electrical T junction 24 includes a first resistor 26 connected between logic supply voltage source 22 and first electrical T junction 24. A second arm 24b of first electrical T junction 24 is electrically connected to second supervisor chip output 14c. Third arm 24c of first electrical T junction 24 is electrically connected to window signal electrical line 27c at a second electrical T junction 27 and serves as a first arm of second electrical T junction 27. A second arm 27b of second electrical T junction 27 is connected to first supervisor chip output 12c. Third arm 27c of second T junction 27 carries Window Signal. The T-junctions operate in conjunction with resistor 26 such that voltage applied to window signal electrical line (third arm 27c) is pulled up through first resistor 26 to Vcc when, and only when, first supervisor chip output 12c and said second supervisor chip output 14c are high impedance; the remainder of the time, the voltage applied to window signal electrical line (third arm 27c) is either 0 or a logic low signal.

In some embodiments, first and second timing capacitors 16, 20 are formed of a C0G/NP0 material. capacitors with these temperature coefficients have very little capacitance drift over temperature, which allows for the timing to be very stable. Also, it is not shown, but additional capacitors can be placed in parallel with the timing capacitors to trim the circuit to a specific value during manufacturing.

Figure 4:
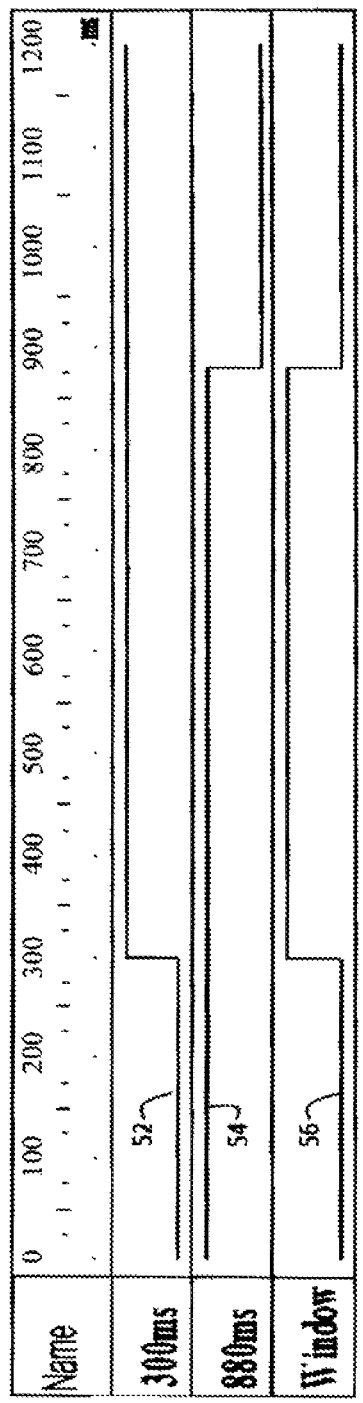
FIG. 4 is a timing diagram illustrating an example of a Window Signal that could be generated using multiple supervisor chip embodiments.

FIG. 4 illustrates a timing diagram for embodiments that employ two supervisor chips to create the timing window (electronically implemented via Window Signal 56). 52 represents output from second supervisor output 14c, where a high state indicates high impedance at 14c and a low state indicates logic low signal asserted at 14c. 54 represents output from first supervisor output 12c, where a high state indicates high impedance at 12c and a low state indicates logic low signal asserted at 12c. Whenever either chip's output is low, Window Signal 56 will be low, and whenever both outputs 12c, 14c are high impedance, Window Signal 56 voltage will be logic high (by pulling voltage up through resistor 26 to Vcc).

Single Supervisor Chip Embodiments

Figure 2:
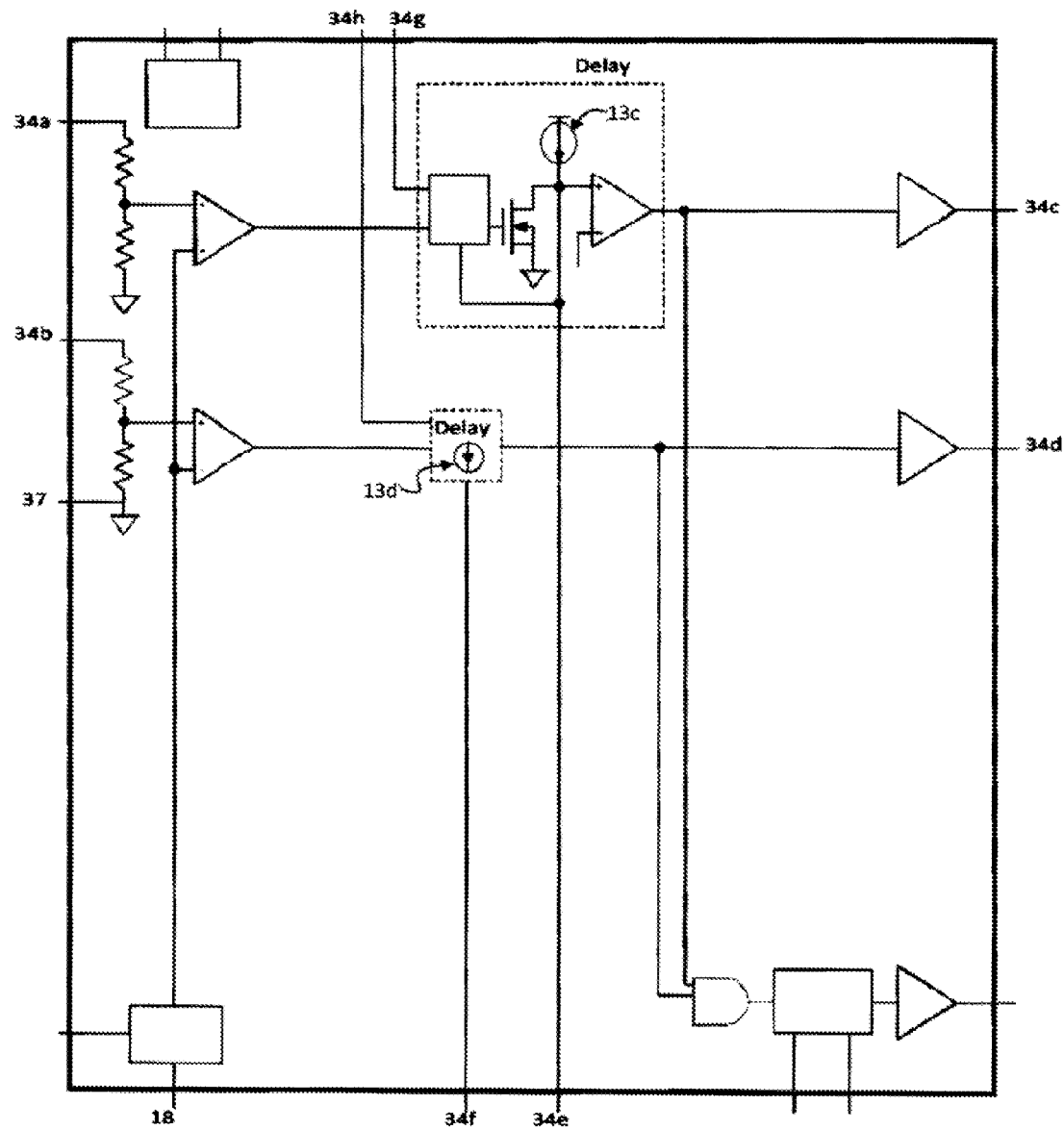
FIG. 2 is an operational diagram of a Maxim MAX16026 supervisor chip.

Embodiments using a single supervisor chip to create the timing window (and assert a logic high state for the Window Signal) are described with reference to FIGS. 2, 5, and 6. In some embodiments, Maxim's MAX16026 chip serves as the supervisor chip; however, any supervisor chip that performs similarly can be used.

A brief description of Maxim's MAX16026 chip 34 is provided with reference to FIG. 5. Supervisor chip 34 is a dual voltage monitoring supervisor chip 34 having a first supervisor input 34a, a second supervisor input 34b, a first supervisor (push-pull) output 34c, a second supervisor (push-pull) output 34d, a first supervisor delay pin 34e, a second supervisory delay pin 34f, a first supervisor enable pin 34g, and a second supervisor enable pin 34h. These chips also include a first internal current source 13c, and a second internal current source 13d.

With reference to Table 3 and FIG. 2, output port 34c goes low when its associated input port 34a voltage drops below its specified threshold or when its associated enable 34g goes low. When the output port's 34c associated input port 34a voltage rises above a threshold value and the output port's associated enable port 34g is logic high, the port's internal current source 13c begins charging an associated external timing capacitor connected from the port's delay pin 34e to ground. The delay time (in seconds) is described by Equation 1, where $V_{TH}$-$C_{DLY}$ is 1V and $I_{CH}$-$C_{DLY}$=0.25 microAmperes.

$$t_{DELAY} = \frac{V_{TH} - C_{DLY}}{I_{CH} - C_{DLY}} \times C_{CDLY} + 35 \times 10^6 \quad \text{Equation 1}$$

TABLE 3

| INPUT 1 | ENABLE 1 | OUTPUT 1 |
| --- | --- | --- |
| Vinput1 < Vthreshold | Low | Low |
| Vinput1 < Vthreshold | High | Low |
| Vinput1 > Vthreshold | Low | Low |
| Vininput1 > Vthreshold | High | High after capacitor determined time delay; Low before capacitor controlled time delay |

With reference to Table 4 and FIG. 2, output port 34d goes low when its associated input port 34b voltage drops below its specified threshold or when its associated enable 34h goes low. When the output port's 34d associated input port 34b voltage rises above a threshold value and the output port's associated enable port 34h is logic high, the port's internal current source 13d begins charging an associated external timing capacitor connected from the port's delay pin 34f to ground. Once the voltage at the output port's 34d associated delay pin 34f reaches a pre-determined threshold, (and assuming the output port's associated enable pin and associated input voltage are high) output port 34d will assert a logic high signal. The delay time (in seconds) is described by Equation 1.

TABLE 4

| INPUT 2 | ENABLE 2 | OUTPUT 2 |
| --- | --- | --- |
| Vinput2 < Vthreshold | Low | Low |
| Vinput2 < Vthreshold | High | Low |
| Vinput2 > Vthreshold | Low | Low |
| Vininput2 > Vthreshold | High | High after capacitor determined time delay; Logic low before capacitor controlled time delay |

Turning now to FIG. 5, single supervisor chip embodiments of the invention include a first timing capacitor 36 and a second timing capacitor 38. First timing capacitor 36 is electrically connected between first supervisor delay pin 34e and ground 37; second timing capacitor 38 is electrically connected between second supervisor delay pin 34f and ground 37. First supervisor input 34a and second supervisor input 34b are electrically connected to a Start Signal source 42 such that a Start Signal asserted by Start Signal source 42 is applied high simultaneously to first supervisor input 34a and second supervisor input 34b. When Start Signal is applied high (above the supervisor chip's input voltage threshold) to first supervisor input 34a, first internal current source 13c delivers its current to first delay pin 34e, from where the current then flows to, and charges, first timing capacitor 36. Likewise, when Start Signal is applied high to second supervisor input 34b, second internal current source 13d delivers its current to second delay pin 34f, from where the current then flows to, and charges, second timing capacitor 38.

First supervisor 34 is adapted to assert a logic level low signal at first supervisor output 34c until a first pre-determined amount of time after first internal current source 13c begins charging first timing capacitor 36 an amount sufficient to make the voltage at first supervisor delay pin 34e greater than a first pre-determined delay voltage threshold amount, at which point supervisor 34 asserts a logic level high signal at first supervisor output 34c. Likewise, supervisor 34 is adapted to assert a logic level low signal at second supervisor output 34d until second internal current source 13d charges second timing capacitor 38 amount sufficient to make the voltage at second supervisor delay pin 34f greater than a second pre-determined delay voltage threshold amount, at which point supervisor 34 asserts a logic level high signal at second supervisor output 34d.

Embodiments include a two input exclusive-OR gate 40 having a first exclusive-OR gate input 40a, a second exclusive-OR gate input 40b, and an exclusive-OR gate output 40c. First exclusive-OR gate input 40a is electrically connected to first supervisor output 34c and second exclusive-OR gate input 40b is electrically connected to second supervisor output 34d. Exclusive-OR gate 40 applies a logic level high to exclusive-OR gate output 40c only while a logic level high is asserted at one but not both of first supervisor output 34c and said second supervisor output 34d.

In the illustrated embodiment, first timing capacitor 36 is 0.075 microfarads and the pre-determined amount of time after applying Start Signal high to first supervisor input 34a at which the opening edge of the window will occur is 300 milliseconds. In the illustrated embodiment, second timing capacitor 38 is 0.22 microfarads and the pre-determined amount of time after applying Start Signal high to second supervisor input 34b at which the closing edge of the window will occur is 880 milliseconds.

In some embodiments, first and second timing capacitors 36, 38 are formed of a C0G/NP0 material. Capacitors with these temperature coefficients have very little capacitance drift over temperature, which allows for the timing to be very stable. Also, it is not shown, but additional capacitors can be placed in parallel with the timing capacitors to trim the circuit to a specific value during manufacturing.

Figure 6:
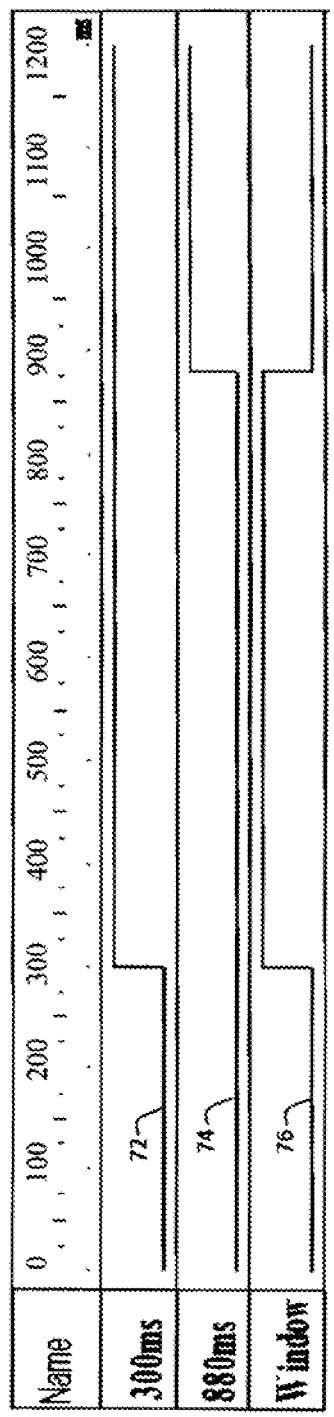
FIG. 6 is a timing diagram illustrating an example of a Window Signal that could be generated using single supervisor chip embodiments.

FIG. 6 illustrates a timing diagram for embodiments that employ a single supervisor chip to create the timing window (electronically implemented via Window Signal 76). 72 represents output from first supervisor output 34*c*, where a high state indicates a logic high signal at 34*c* and a low state indicates logic low signal asserted at 34*c*. 74 represents output from second supervisor output 34*d*, where a high state indicates a logic high signal at 34*d* and a low state indicates logic low signal asserted at 34*d*. Whenever output of both chips is high (880 ms+), or output of both chips is low (0-300 ms), Window Signal 76 will be low, and whenever one output is low and the other is logic high (as between 300 ms and 880 ms), Window Signal 76 is logic high.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

The invention claimed is:

1. A timing circuit, comprising:
a logic supply voltage source supplying a Vcc voltage;
at least one capacitor;
at least one supervisor chip adapted to cooperate with said at least one capacitor to create a timing window, wherein said timing window opens a first pre-determined amount of time after a time zero and remains open a second pre-determined amount of time, wherein said window is electronically represented as a window signal, wherein said window is open when said window signal is high and closed when said window signal is low, wherein said time zero is a point in time at which a start signal is asserted, wherein said start signal is asserted in response to occurrence of a first event;
a windowed signal source to assert a windowed signal, wherein said windowed signal is an electrical signal to be analyzed for validation of first-occurrence of a second event while said window is open;
a first latch having a first latch d input, a first latch clock input, a first latch reset/clear pin, and a first latch q output; wherein said windowed signal is applied to said first latch clock; wherein said first latch q output asserts logic level high when said windowed signal first transitions from low-to-high;
a second latch having a second latch d input, a second latch clock input, a second latch reset/clear pin, and a second latch q output; wherein said first latch q output is electrically connected to said second latch clock input; wherein said window signal is applied to said second latch d input; and
wherein said second latch is adapted to latch in a logic state of said window signal at a time of a first low-to-high transition of said windowed signal.

2. The timing circuit of claim 1, wherein said at least one capacitor and said at least one supervisor chip adapted to cooperate with said at least one capacitor to create a timing window comprises:
a first timing capacitor;
a first supervisor chip having a first supervisor chip voltage input, a first supervisor chip Vcc input, a first supervisor chip output, a first supervisor chip ground, a first supervisor chip delay pin, a first supervisor chip enable pin, and a first supervisor chip internal current source; wherein said first timing capacitor is electrically connected between said first supervisor chip delay pin and ground; wherein said first supervisor chip enable pin is electrically connected to ground; wherein said logic supply voltage source is electrically connected to said first supervisor chip Vcc input;
wherein said first supervisor chip output is high impedance when voltage applied to said first supervisor chip voltage input is greater than an input voltage threshold of said first supervisor chip and voltage at said first supervisor chip delay pin is less than a first pre-determined delay voltage;
wherein said first supervisor chip output asserts a logic signal low a first pre-determined amount of time after voltage greater than said first supervisor chip voltage input threshold is applied to said first supervisor chip voltage input and logic signal low is applied to said first supervisor chip enable pin; wherein said first pre-determined amount of time is an amount of time it takes voltage at said first supervisor chip delay pin to reach said first pre-determined delay voltage after said first supervisor internal current source beings to charge said first timing capacitor;
a second timing capacitor;
a second supervisor chip having a second supervisor chip voltage input, a second supervisor chip Vcc input, a second supervisor chip output, a second supervisor chip ground, a second supervisor chip delay pin, a second supervisor chip enable pin signal; wherein said second timing capacitor is electrically connected between said second supervisor chip delay pin and ground;
wherein said second supervisor chip asserts a logic low signal at said second supervisor chip output when voltage applied to said second supervisor chip voltage input is greater than an input voltage threshold of said second supervisor chip and voltage at said second supervisor chip delay pin is less than a second pre-determined delay voltage;
wherein said second supervisor chip output becomes high impedance a second pre-determined amount of time after voltage greater than said second supervisor chip voltage input threshold is applied to said second supervisor chip voltage input and logic signal high is applied to said second supervisor chip enable pin; wherein said second pre-determined amount of time is an amount of time it takes voltage at said second supervisor chip delay pin to reach a second pre-determined delay voltage after said second supervisor chip internal current source begins to charge said second timing capacitor;
a window signal electrical line to carry said window signal;
a first electrical T junction, wherein a first arm of said first electrical T junction includes a first resistor electrically connected between said logic supply voltage source and said first electrical T junction, wherein a second arm of said first electrical T junction is electrically connected to said second supervisor chip output, wherein said third arm of said first electrical T junction is electrically connected to said window signal electrical line at a second electrical T junction and serves as a first arm of said second electrical T junction;
wherein a second arm of said second electrical T junction is connected to said first supervisor chip output; and
wherein a third arm of said second T junction carries said window signal, wherein voltage on said third arm of said second electrical T junction is pulled up through said first resistor to said logic supply voltage source when said first supervisor chip output and said second supervisor chip output are high impedance.

3. The timing circuit of claim 1, wherein said at least one capacitor and said at least one supervisor chip adapted to cooperate with said at least one capacitor to create a timing window comprises:

a first timing capacitor;

a second timing capacitor;

a dual voltage monitoring supervisor chip having a first supervisor input signal pin, a second supervisor input signal pin, a first supervisor output, a second supervisor output, a first supervisor delay pin, a second supervisor delay pin, a first internal current source, and a second internal current source;

wherein said first timing capacitor is electrically connected between said first supervisor delay pin and ground;

wherein said second capacitor is electrically connected between said second supervisor delay pin and ground;

wherein said first supervisor input and said second supervisor input are electrically connected to a start signal source such that said a start signal asserted by said start signal source is simultaneously applied to said first supervisor input and said second supervisor input;

wherein said first supervisor output is adapted to assert a logic level low signal until said first internal current source charges said first capacitor an amount sufficient to make a voltage at said first supervisor delay pin greater than a pre-determined amount, at which point a logic level high signal is asserted at said first supervisor output; wherein said second supervisor output is adapted to assert a logic level low signal until said second internal current source charges said second capacitor an amount sufficient to make a voltage at said second supervisor delay pin greater than said pre-determined amount, at which point logic level high signal is asserted at said second supervisor output; and a two input exclusive-OR gate having a first exclusive-OR gate input, a second exclusive-OR gate input, and an exclusive-OR gate output, wherein said first exclusive-OR gate input is electrically connected to said first supervisor output and said second exclusive-OR gate input is electrically connected to said second supervisor output; wherein said exclusive-OR gate applies a logic level high to said exclusive-OR gate output only while a logic level high is asserted at one but not both of said first supervisor output and said second supervisor output, wherein the signal asserted at said exclusive-OR gate output is said window signal.

4. The timing circuit of claim 2, further comprising a weapon fuze, wherein said first event is a first arming event and said second event is a second arming event, wherein said second arming event is required to first occur while said window is open in order to arm said fuze.

5. The timing circuit of claim 3, further comprising a weapon fuze, wherein said first event is a first arming event and said second event is a second arming event, wherein said second arming event is required to first occur while said window is open in order to arm said fuze.

6. The timing circuit of claim 2, wherein said first timing capacitor is 0.22 microfarads and said second timing capacitor is 0.075 microfarads.

7. The timing circuit of claim 3, wherein said first timing capacitor is 0.22 microfarads and said second timing capacitor is 0.075 microfarads.

8. The timing circuit of claim 7, wherein said first pre-determined amount of time is 880 milliseconds.

9. The timing circuit of claim 2, wherein said second pre-determined amount of time is 300 milliseconds.

* * * * *